(12) United States Patent  
Cho et al.

(10) Patent No.: US 11,555,959 B2  
(45) Date of Patent: Jan. 17, 2023

(54) PHOTONIC INTEGRATED CIRCUIT DEVICES AND METHODS OF FORMING SAME

(71) Applicant: Samsung Electronics Co., Ltd., Suwon-si (KR)

(72) Inventors: Keun Yeong Cho, Suwon-si (KR); Hyunil Byun, Seongnam-si (KR); Ho-Chul Ji, Seongnam-si (KR)

(73) Assignee: Samsung Electronics Co., Ltd.

( * ) Notice: Subject to any disclaimer, the term of this patent is extended or adjusted under 35 U.S.C. 154(b) by 136 days.

(21) Appl. No.: 17/102,978

(22) Filed: Nov. 24, 2020

(65) Prior Publication Data

US 2021/0103094 A1 Apr. 8, 2021

Related U.S. Application Data

(63) Continuation of application No. 16/430,763, filed on Jun. 4, 2019, now Pat. No. 10,877,212.

(30) Foreign Application Priority Data

Oct. 19, 2018 (KR) .................. 10-2018-0124816

(51) Int. Cl.

| | | |
|---|---|---|
| *G02B 6/12* | (2006.01) | |
| *G01M 11/00* | (2006.01) | |
| *G02F 1/225* | (2006.01) | |
| *H01L 27/144* | (2006.01) | |
| *H01L 27/06* | (2006.01) | |
| *G02B 6/13* | (2006.01) | |

(52) U.S. Cl.
CPC ........ *G02B 6/12004* (2013.01); *G01M 11/33* (2013.01); *G02F 1/2257* (2013.01); *H01L 27/0611* (2013.01); *H01L 27/144* (2013.01); *G02B 6/13* (2013.01); *G02B 2006/12061* (2013.01); *G02B 2006/12107* (2013.01); *G02B 2006/12123* (2013.01)

(58) Field of Classification Search
CPC ........ G02B 6/12; G02B 6/13; G02B 6/12004; G02B 2006/12107; G02B 2006/12123; G02B 2006/12061; G01M 11/00; G01M 11/33; G02F 1/025; G02F 1/2257; H01L 27/0611; H01L 27/144

See application file for complete search history.

(56) References Cited

U.S. PATENT DOCUMENTS

| | | |
|---|---|---|
| 7,218,861 B2 | 5/2007 | Totsuka et al. |
| 7,341,384 B2 | 3/2008 | Chan et al. |
| 9,236,958 B2 | 1/2016 | Stone et al. |
| 9,766,410 B1 | 9/2017 | Chen |
| 9,813,152 B2 | 11/2017 | Pinguet et al. |
| 9,941,957 B2 | 4/2018 | Sahni |
| 9,960,888 B2 | 5/2018 | Gloeckner et al. |

(Continued)

*Primary Examiner* — Michael P Mooney
(74) *Attorney, Agent, or Firm* — Myers Bigel, P.A.

(57) ABSTRACT

A photonic integrated circuit device includes a semiconductor substrate (e.g., wafer) having a chip region therein, which is bounded on at least one side thereof by a scribe line. The chip region includes an optical transmitter, an optical receiver and a test optical waveguide. This test optical waveguide is coupled to the optical transmitter and the optical receiver and overlaps the scribe line. During a substrate dicing operation, a portion of the test optical waveguide overlapping the scribe line is removed.

19 Claims, 15 Drawing Sheets

(56) References Cited

U.S. PATENT DOCUMENTS

2010/0026992 A1    2/2010  Rosiewicz
2017/0195055 A1*  7/2017  Evans ................ H04B 10/503
2018/0307062 A1   10/2018  Poulin
2019/0361180 A1* 11/2019  Lam ......................... G02B 6/12

* cited by examiner

PHOTONIC INTEGRATED CIRCUIT DEVICES AND METHODS OF FORMING SAME

REFERENCE TO PRIORITY APPLICATIONS

This U.S. non-provisional application is a continuation of U.S. patent application Ser. No. 16/430,763, filed Jun. 4, 2019, which claims priority under 35 U.S.C § 119 to Korean Patent Application No. 10-2018-0124816, filed Oct. 19, 2018, the disclosures of which are hereby incorporated herein by reference.

BACKGROUND

The present inventive concepts relate to photonic integrated circuit devices and methods of fabricating the same and, more particularly, to photonic integrated circuit devices including an optical transmitter and an optical receiver, and methods of fabricating the same.

The demands to downsize and have higher speed of electronic devices have led to a need for high-speed transmission of signals. Because electrical signals are transmitted through interconnection lines, such as copper lines, there is an inherent physical limitation in accelerating transmission of the electrical signals. As a result, studies are being conducted on photonic integrated circuit devices to transmit optical signals.

SUMMARY

Some example embodiments of the present inventive concepts provide a photonic integrated circuit device, which enables the electrical testing of optical transmitters and optical receivers at a wafer level, prior to dicing into individual photonic integrated circuit devices.

Some additional embodiments of the present inventive concepts provide methods of fabricating photonic integrated circuit devices to achieve improved reliability.

An object of the present inventive concepts is not limited to those mentioned above, and other objects which have not been mentioned above will be clearly understood to those skilled in the art from the following description.

According to some example embodiments of the present inventive concepts, a photonic integrated circuit device may include a semiconductor substrate (e.g., wafer) having a plurality of chip regions therein and scribe line regions between the chip regions. An optical transmitter and an optical receiver are provided on each of the chip regions of the semiconductor substrate. A test optical waveguide is provided, which is disposed on the semiconductor substrate. This test optical waveguide connects the optical transmitter to a photodetector provided on the optical receiver.

According to further embodiments of the present inventive concepts, an integrated circuit device is provided, which includes a substrate (e.g., wafer) having a chip region therein bounded on at least one side thereof by a first scribe line. The chip region includes an optical transmitter, an optical receiver and a test optical waveguide to facilitate substrate level testing (e.g., wafer scale testing) of the optical transmitter and optical receiver. The test optical waveguide is coupled to the optical transmitter and the optical receiver, and overlaps the first scribe line. In some of these embodiments, the substrate includes a two-dimensional array of chip regions therein, which are separated from each other by a two-dimensional grid of scribe lines (including the first scribe line). The optical receiver may also include a photodetector, which is optically coupled to the test optical waveguide. The photodetector may include a cladding layer on the substrate, a silicon core layer on the cladding layer and a germanium pattern on the silicon core layer. The test optical waveguide may be optically coupled to the silicon core layer.

According to additional embodiments of the present inventive concepts, a method of forming a photonic integrated circuit device is provided, which includes performing wafer level testing of a plurality of photonic integrated circuit devices having respective test optical waveguides thereon that facilitate the wafer level optoelectronic testing. After testing, the wafer is diced along a plurality of scribe lines to thereby define a plurality of photonic integrated circuit chips. During the dicing step, the test optical waveguides, which can overlap scribe lines on the wafer, are cut.

According to some additional embodiments of the present inventive concepts, a method of fabricating a photonic integrated circuit device may include providing a semiconductor substrate that includes a plurality of chip regions and a scribe line region between the chip regions. A plurality of photonic integrated circuit devices are formed in corresponding chip regions. These photonic integrated circuit devices include an optical transmitter, an optical receiver, and a test optical waveguide that connects the optical transmitter to the optical receiver. A test process is performed in which the optical transmitter is provided with an electrical test signal to test the optical transmitter and the optical receiver at the substrate (e.g., wafer) level. After the "wafer level" test process is performed, the semiconductor substrate is cut along the scribe line regions to individually separate the photonic integrated circuit devices from the substrate.

Details of other example embodiments are included in the description and drawings.

DETAILED DESCRIPTION OF EMBODIMENTS

The following will now describe a photonic integrated circuit device and a method of fabricating the same according to some example embodiments of the present inventive concepts in conjunction with the accompanying drawings.

Figure 1:
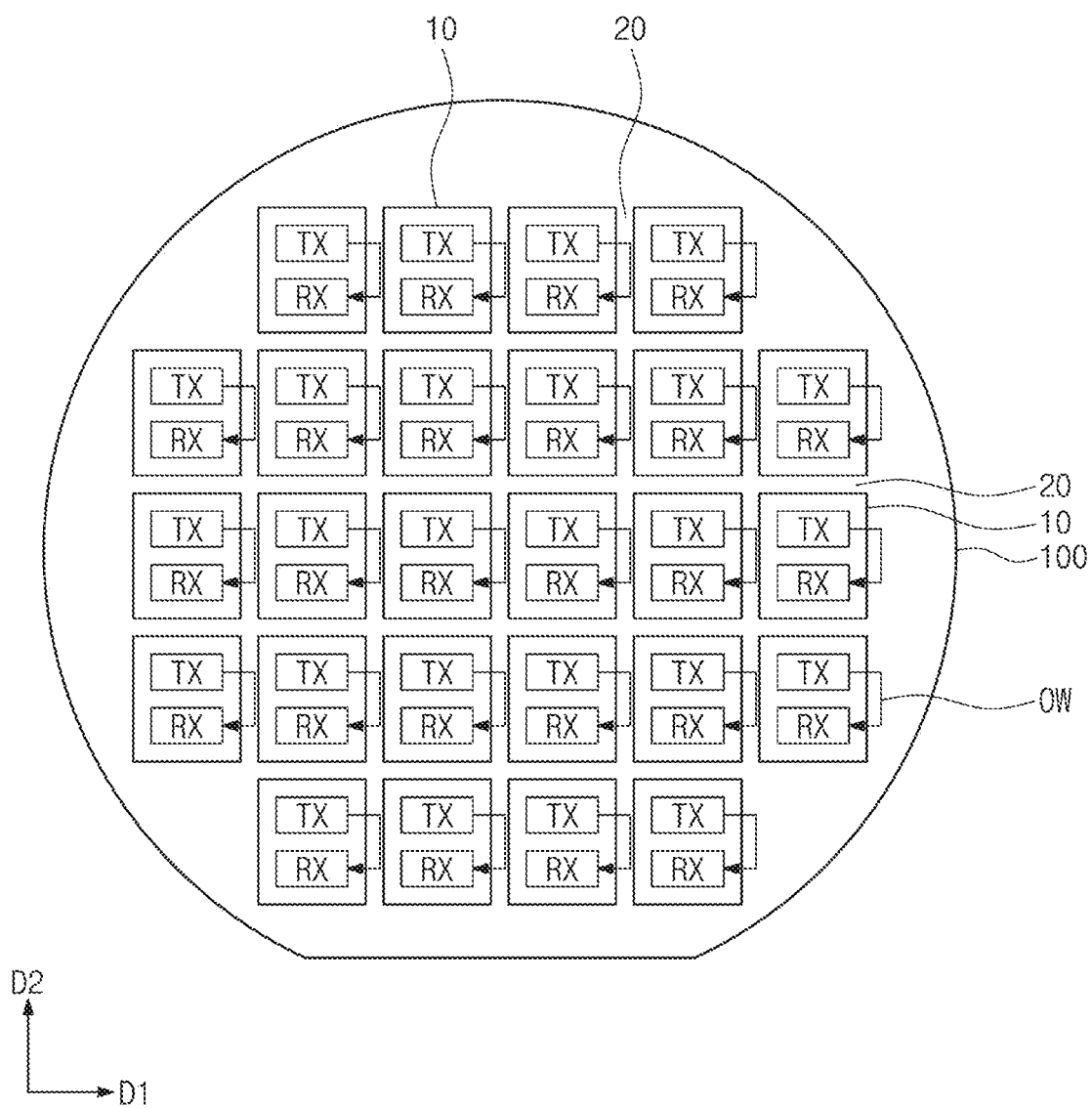
FIG. 1 illustrates a plan view showing a semiconductor substrate including photonic integrated circuit devices according to some example embodiments of the present inventive concepts.
Figure 2:
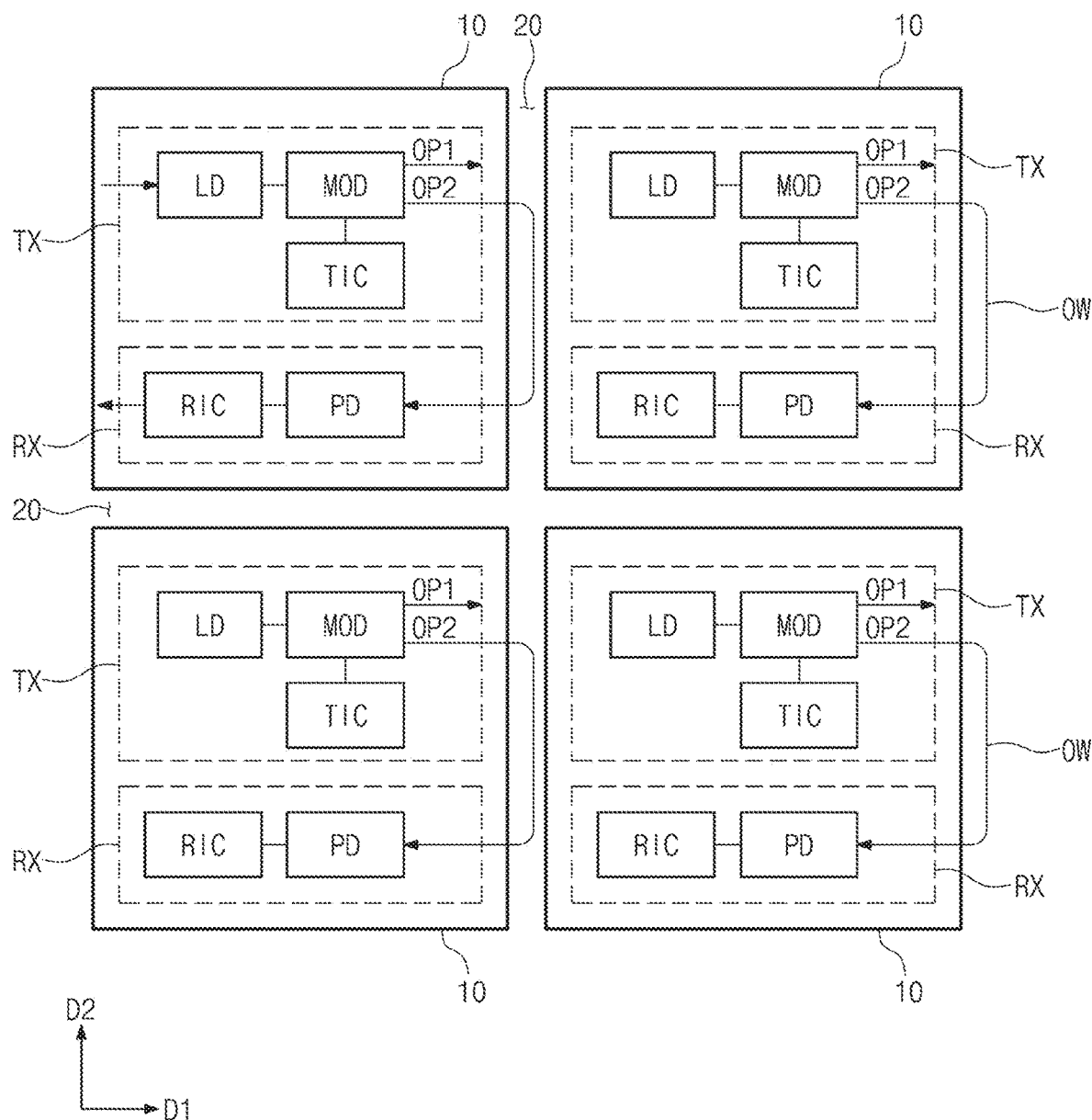
FIG. 2 illustrates an enlarged view showing a portion of FIG. 1.

FIG. 1 illustrates a plan view showing a semiconductor substrate including photonic integrated circuit devices according to some example embodiments of the present inventive concepts. FIG. 2 illustrates an enlarged view showing a portion of FIG. 1. Referring to FIG. 1, a semiconductor substrate 100 may include chip regions 10 on which optical devices are formed and a scribe line region 20 between the chip regions 10.

The semiconductor substrate 100 may be one of a semiconductor material (e.g., silicon wafer), a dielectric material (e.g., glass), and a semiconductor or conductor covered with a dielectric material.

The chip regions 10 may be two-dimensionally arranged along a first direction D1 and a second direction D2 perpendicular to the first direction D1. The scribe line region 20 may surround each of the chip regions 10.

A photonic integrated circuit device may be formed on each of the chip regions 10. The photonic integrated circuit device may include an optical transmitter TX and an optical receiver RX. The photonic integrated circuit device may be a semiconductor chip including the optical transmitter TX and the optical receiver RX.

Each of the chip regions 10 of the semiconductor substrate 100 may include the optical transmitter TX that transmits optical signals and the optical receiver RX that receives optical signals. In addition, the chip regions 10 of the semiconductor substrate 100 may further include semiconductor memory devices such as dynamic random access memory (DRAM) devices, static random access memory (SRAM) devices, or NAND Flash memory devices, and/or processors such as micro-electromechanical system (MEMS) devices, CPU, or DSP. Each of the chip regions 10 of the semiconductor substrate 100 may also include chip pads through which data or signals are input or output.

The optical transmitter TX, the optical receiver RX, and an optical waveguide OW for testing the optical transmitter TX and the optical receiver RX may be provided on each of the chip regions 10 of the semiconductor substrate 100. For example, on each of the chip regions 10, the optical waveguide OW may directly connect the optical transmitter TX to the optical receiver RX. On each of the chip regions 10, the optical waveguide OW for testing may be used as a built-in self-test (BIST) path between the optical transmitter TX and the optical receiver RX. The optical waveguide OW for testing may have a portion formed on the scribe line region 20.

Referring to FIG. 2, the scribe line region 20 may be provided between the chip regions 10, and the optical transmitter TX and the optical receiver RX may be provided on each of the chip regions 10. The optical transmitter TX may include a light-source device LD, an optical modulator MOD, and a transmission circuit device TIC. The optical receiver RX may include an photodetector PD and a reception circuit device RIC. The photodetector PD may be connected through the optical waveguide OW to the optical transmitter TX.

The optical transmitter TX may generate first and second output optical signals OP1 and OP2, one of which optical signals OP1 and OP2 may be provided to the optical receiver RX on the semiconductor substrate 100. In this configuration, on the semiconductor substrate 100, the optical transmitter TX and the optical receiver RX may communicate optical signals without input and output of external optical signals.

Figure 3:
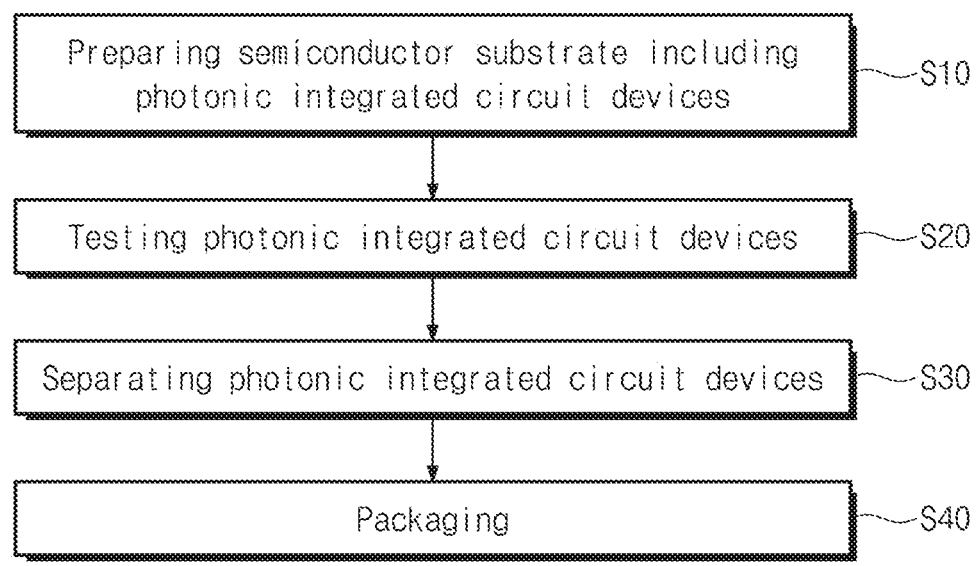
FIG. 3 illustrates a flow chart showing a method of fabricating a photonic integrated circuit device according to some example embodiments of the present inventive concepts.

FIG. 3 illustrates a flow chart showing a method of fabricating a photonic integrated circuit device according to some example embodiments of the present inventive concepts. Referring to FIG. 3, and as discussed above with reference to FIGS. 1 and 2, the semiconductor substrate 100 may be prepared which includes a plurality of the chip regions 10 and the scribe line region 20 (S10). The photonic integrated circuit devices may be formed on corresponding chip regions 10 by performing semiconductor device fabrication processes, such as photolithography and etching (S20). For example, as shown in FIG. 2, the optical transmitter TX, the optical receiver RX, and the optical waveguide OW may be formed on each of the chip regions 10 of the semiconductor substrate 100.

After the photonic integrated circuit devices are formed on the semiconductor substrate 100, a test process may be performed on the photonic integrated circuit devices (S30). When the test process is performed to provide electrical signals to test pads on each of the chip regions 10, optical signals may be input and output to test the optical transmitter TX and the optical receiver RX. The test process may be performed in such a way that electrical probe pins are allowed to contact the test pads.

For example, when electrical test signals are provided to the optical transmitter TX, optical test signals may be generated through the optical waveguide OW for testing from the optical transmitter TX. The optical test signals may be provided to the optical receiver RX through the optical waveguide OW for testing. The optical receiver RX may receive the optical test signals and estimate their quality. For example, an error detector of the optical receiver RX may determine whether or not errors are introduced at optical signals received in the photodetector PD. Thus, before the photonic integrated circuit devices are individually separated into respective "chips", the optical transmitter and receiver TX and RX on the semiconductor substrate 100 (e.g., wafer) may be tested only with an electrical probe, and without using an optical probe. After the test process, a sawing or dicing process may be performed along the scribe line region 20. The semiconductor substrate 100 may then be individually separated into the chip regions 10 on which the photonic integrated circuit devices are formed (S40).

A packaging process may be performed on the individually separated photonic integrated circuit device (S50).

Figure 4A:
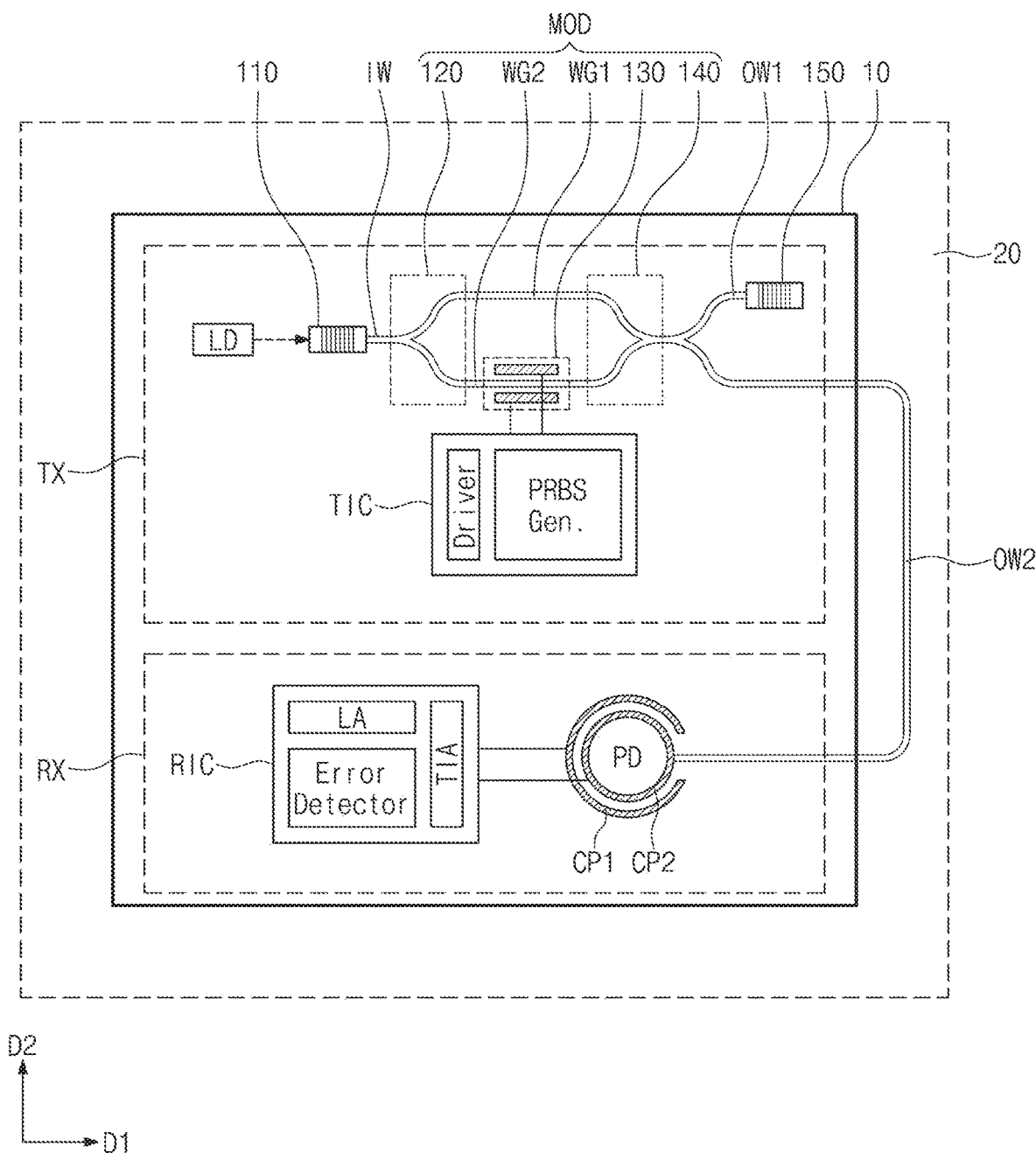
FIGS. 4A and 4B illustrate schematic diagrams showing states before and after testing a photonic integrated circuit device according to some example embodiments of the present inventive concepts.
Figure 4B:
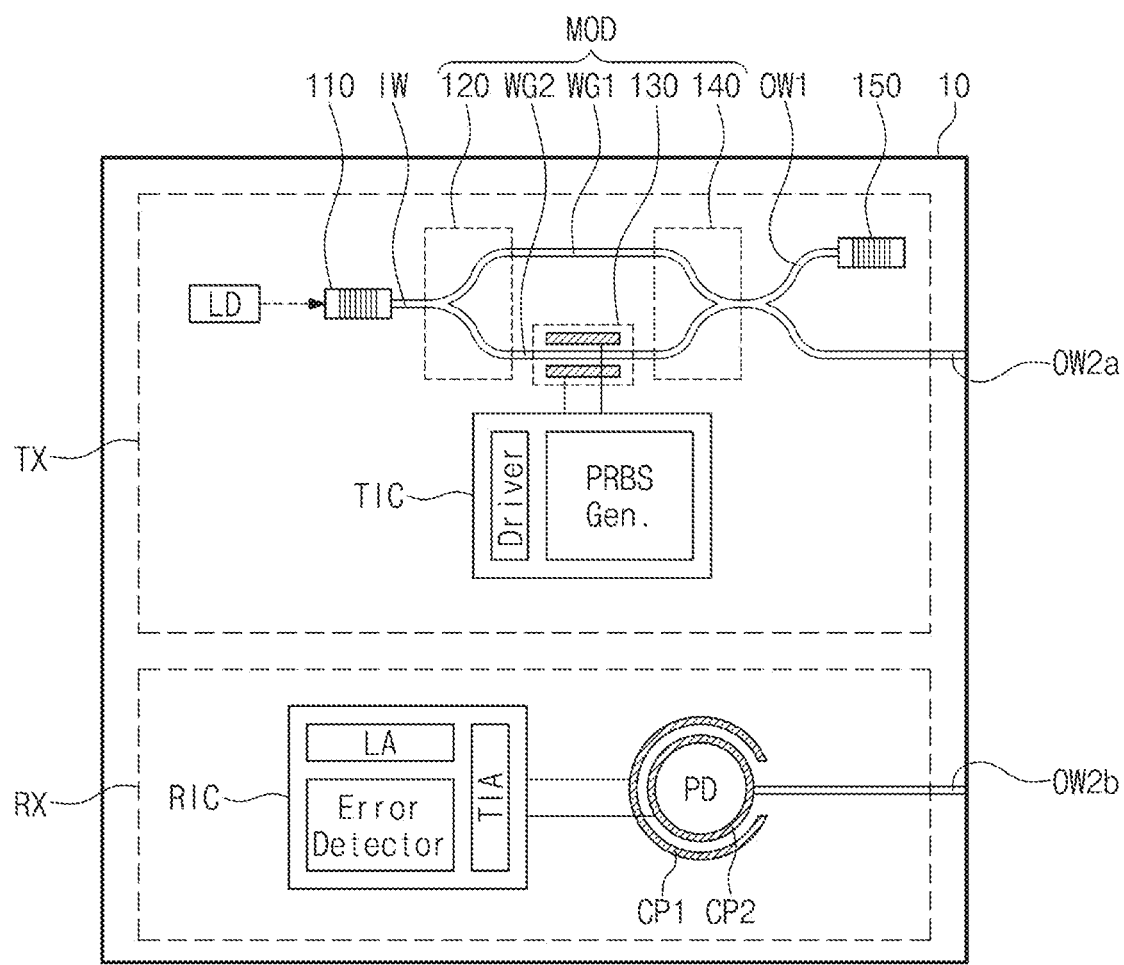

FIGS. 4A and 4B illustrate schematic diagrams showing states before and after testing a photonic integrated circuit device according to some example embodiments of the present inventive concepts. Referring to FIGS. 1 and 4A, an optical transmitter TX and an optical receiver RX may be provided on a chip region 10 of a semiconductor substrate 100. The chip region 10 may be surrounded by a scribe line region 20 of the semiconductor substrate 100.

The optical transmitter TX may include a light-source device LD, an optical modulator MOD, and a transmission circuit device TIC. The light-source device LD may be spaced apart from the optical modulator MOD, and an adhesive layer may be used to attach the light-source device LD to the semiconductor substrate 100. The light-source device LD may be, for example, a laser diode. Optical signals output from the light-source device LD may be transmitted to the optical modulator MOD.

The optical modulator MOD may modulate the optical signals based on electrical signals from the transmission circuit device TIC, and then may output modulated optical signals through output optical waveguides OW1 and OW2 which will be discussed below. The modulated optical signals may be externally output through an optical fiber or an optical fiber array. The optical modulator MOD may be configured in such a way that a PN junction diode is coupled to an optical waveguide formed by semiconductor fabrication processes.

For example, the optical modulator MOD may include an input waveguide IW, an optical splitter 120, a phase modulator 130, an optical coupler 140, and first and second output optical waveguides OW1 and OW2. The optical modulator MOD may further include an input grating coupler 110 that receives optical signals from the light-source device LD and an output grating coupler 150 that externally outputs the modulated optical signals. The output grating coupler 150 may be connected to an end of the first output optical waveguide OW1.

An optical signal may be provided through the input grating coupler 110, and then branched at the optical splitter 120 into a first waveguide WG1 and a second waveguide WG2. The optical signal branched into the first waveguide WG1 may not be phase-modulated, and the optical signal branched into the second waveguide WG2 may be phase-modulated at the phase modulator 130. The optical signals passing through the first and second waveguides WG1 and WG2 may be converged at the optical coupler 140, which may result in interference between the optical signals. The first and second output optical waveguides OW1 and OW2 may output the optical signals that have experienced constructive or destructive interference at the optical coupler 140. Thus, the first output optical waveguide OW1 may output a first modulated optical signal, and the second output optical waveguide OW2 may output a second modulated optical signal. The first and second modulated optical signals may be complimentary to each other.

The optical waveguides IW, WG1, WG2, OW1, and OW2 may be formed of single crystalline silicon, and their lower and upper cladding layers may be formed of silicon oxide. The phase modulator 130 may include a first electrode doped with a p-type dopant, a second electrode doped with an n-type dopant, and the second waveguide WG2 between the first and second electrodes.

The transmission circuit device TIC may apply electrical signals to the first and second electrodes of the phase modulator 130 and may modulate phases of optical signals. The transmission circuit device TIC may include a pseudo-random binary sequence (PRBS) generator and a driver. The first and second electrodes of the phase modulator 130 may be connected through conductive lines to the transmission circuit device TIC. The PRBS generator may be used to output modulated optical signals through the first and second output optical waveguides OW1 and OW2.

The transmission circuit device TIC may include conductive pads and have connection with input/output pads (not shown) formed on the semiconductor substrate 100. The input grating coupler 110 may be obtained by forming gratings on an end of the input optical waveguide IW, and the output grating coupler 150 may be obtained by forming grating on an end of the first output optical waveguide OW1. The input and output grating couplers 110 and 150 may transceive optical signals by using the fact that optical signals are diffracted while passing through the gratings and may filter optical signals by controlling intervals between the gratings.

The optical receiver RX may include a photodetector PD and a reception circuit device RIC connected to the photodetector PD. The photodetector PD may have connection with the second output optical waveguide OW2 and receive the second modulated optical signal output from the optical transmitter TX.

The photodetector PD may include one of a photodiode, an avalanche photodiode, and a PIN photodiode that are formed by semiconductor device fabrication processes. The photodetector PD may detect optical signals that are vertically incident from an optical fiber toward the semiconductor substrate 100, and convert the detected optical signals into electrical signals. The electrical signals generated from the photodetector PD may be output to the reception circuit device RIC through first and second conductive plugs CP1 and CP2. The photodetector PD may further be discussed in detail with reference to FIGS. 5A and 5B.

The reception circuit device RIC may amplify the electrical signals converted in the photodetector PD. The amplified electrical signals may be transmitted through an electrical interface to an external electronic device.

The reception circuit device RIC may detect and amplify the electrical signals converted in the photodetector PD (or a photoelectric conversion device). The reception circuit device RIC may include a transimpedance amplifier TIA, a limiting amplifier LA, and an error detector.

The transimpedance amplifier TIA may convert or amplify the electrical signals output from the photodetector PD. When the electrical signals output from the photodetector PD are current signals whose magnitudes are changed in accordance with input optical signals, the transimpedance amplifier TIA may convert the current signal of the photodetector PD into voltage signals and output the converted voltage signals. The optical signals may change magnitudes of voltages of the electrical signals output from the transimpedance amplifier TIA.

The limiting amplifier LA may amplify electrical signals based on preset voltage levels. The preset voltage levels may be determined as appropriate levels to analyze digital values 0 or 1 included in the electrical signal. The error detector may check errors by comparing a PRBS pattern generated in the PRBS generator of the optical transmitter TX with an electrical signal converted in the photodetector PD.

A test process using electrical probes may be performed on the semiconductor substrate 100 including a plurality of the chip regions 10, and test optical signals may be transmitted from the optical transmitter TX through the second output optical waveguide OW2 to the optical receiver RX. As shown in FIG. 4B, the second output optical waveguide OW2 may include an output segment OW2a connected to the optical transmitter TX, an input segment OW2b connected to the optical receiver RX, and an interconnection segment (see OW2c of FIG. 8A) between the output segment OW2a and the input segment OW2b. The output segment OW2a and the input segment OW2b may be formed on the chip region 10, and the interconnection segment OW2c may be formed on the scribe line region 20.

Referring to FIGS. 1 and 4B, after the test process on the photonic integrated circuit device, a sawing or dicing process may be performed along the scribe line region 20 to cut the second output optical waveguide OW2. For example, the interconnection segment OW2c may be cut on the scribe line region 20, and the second output optical waveguide OW2 may be divided into the output segment OW2a and the input segment OW2b.

In other words, in the separated photonic integrated circuit device, no optical signals may be communicated between the optical transmitter TX and the optical receiver RX, and thus the optical transmitter TX and the optical receiver RX may operate independently of each other.

After the cutting process, optical signals output from the optical transmitter TX may be transmitted to an optical fiber through the first output optical waveguide OW1 and the output grating coupler 150. After the cutting process, the optical signals may be provided through the optical fiber to the photodetector PD of the optical receiver RX.

Figure 5A:
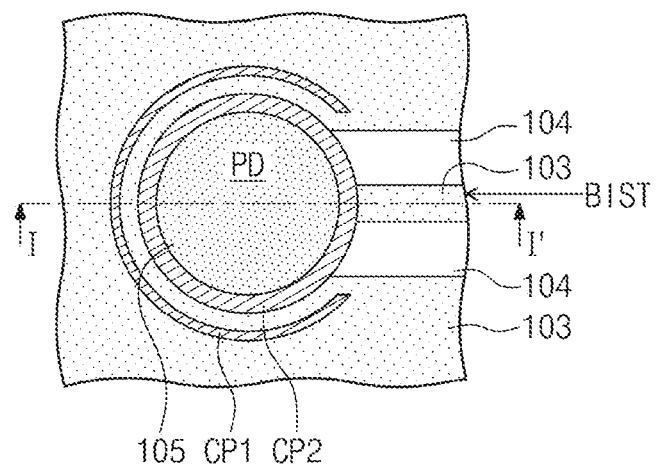
FIG. 5A illustrates a plan view showing a portion of a photonic integrated circuit device according to some example embodiments of the present inventive concepts.
Figure 5B:
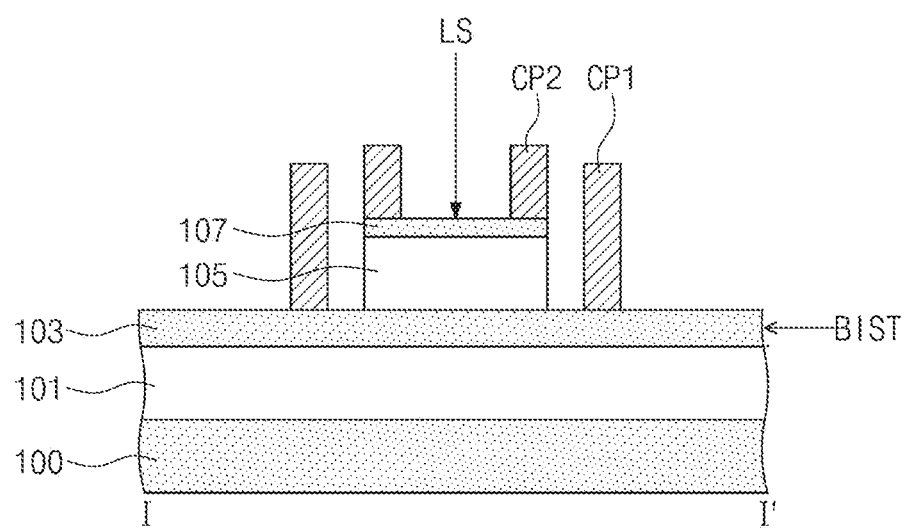
FIG. 5B illustrates a cross-sectional view taken along line I-I' of FIG. 5A, showing a portion of a photonic integrated circuit device according to some example embodiments of the present inventive concepts.

FIG. 5A illustrates a plan view showing a portion of a photonic integrated circuit device according to some example embodiments of the present inventive concepts. FIG. 5B illustrates a cross-sectional view taken along line I-I' of FIG. 5A, showing a portion of a photonic integrated circuit device according to some example embodiments of the present inventive concepts.

Referring to FIGS. 5A and 5B, the photodetector PD may be formed on a silicon-on-insulator (SOI) substrate. For example, a lower cladding layer 101 (e.g., a silicon oxide layer) may be formed on the semiconductor substrate 100, and the lower cladding layer 101 may be provided thereon with a silicon waveguide 103 and a germanium pattern 105 on the silicon waveguide 103.

The silicon waveguide 103 may include therein an n-type doping region doped with an n-type dopant, and the germanium pattern 105 may be provided on its upper portion with a p-type doping region 107 doped with a p-type dopant. The second output optical waveguide (see OW2 of FIG. 4A) may be connected to an end of the silicon waveguide 103. The second output optical waveguide OW2 may be surrounded by a silicon oxide layer 104. A first conductive plug CP1 may be coupled to the n-type doping region of the silicon waveguide 103, and the germanium pattern 105 may be surrounded by the first conductive plug CP1. A second conductive plug CP2 may be coupled to the p-type doping region 107 of the germanium pattern 105 and may be annular-shaped (e.g., ring-shaped).

Optical signals incident along the silicon waveguide 103 may travels in a total reflection mode and may be absorbed into the germanium pattern 105 when reaching the germanium pattern 105. The optical signals absorbed into the germanium pattern 105 may be converted into electrical signals, and the converted electrical signals may be output through the first and second conductive plugs CP1 and CP2.

When the test process is performed, the photodetector PD may detect a test optical signal BIST provided through the second output optical waveguide (see OW2 of FIG. 4A) from the optical transmitter (see TX of FIG. 4A). The photodetector PD may convert the test optical signal BIST into an electrical signal, which test optical signal BIST is provided through the second output optical waveguide (see OW2 of FIG. 4A), and the converted electrical signal may be transmitted to the error detector of the reception circuit device (see RIC of FIG. 4A).

After the semiconductor substrate 100 is cut, an external optical signal LS externally provided via an optical fiber may be converted through the photodetector PD into an electrical signal. The semiconductor substrate 100 may be vertically provided with the external optical signal LS externally provided via an optical fiber.

Figure 6:
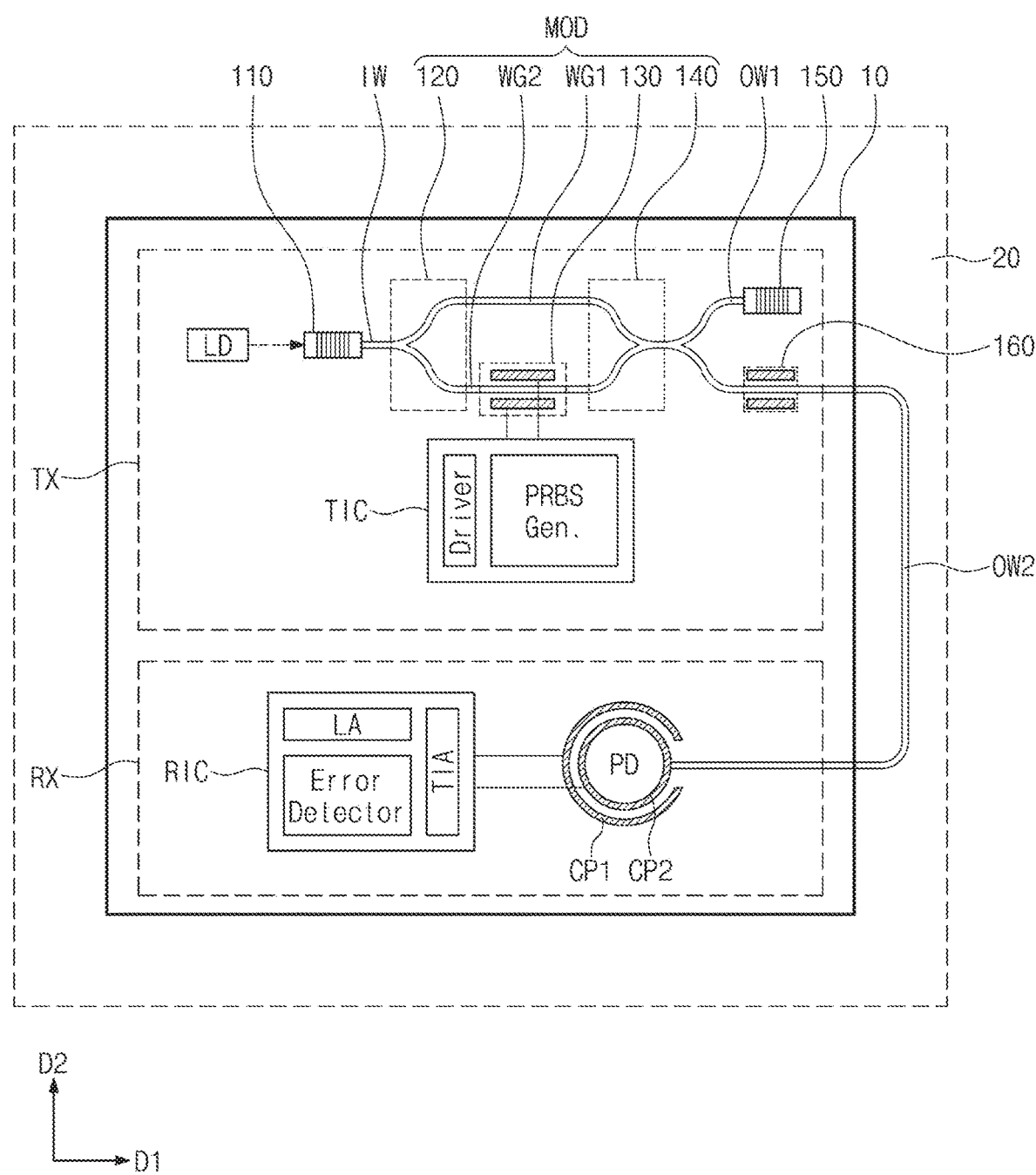
FIGS. 6 and 7 illustrate schematic diagrams showing a photonic integrated circuit device according to some example embodiments of the present inventive concepts.
Figure 7:
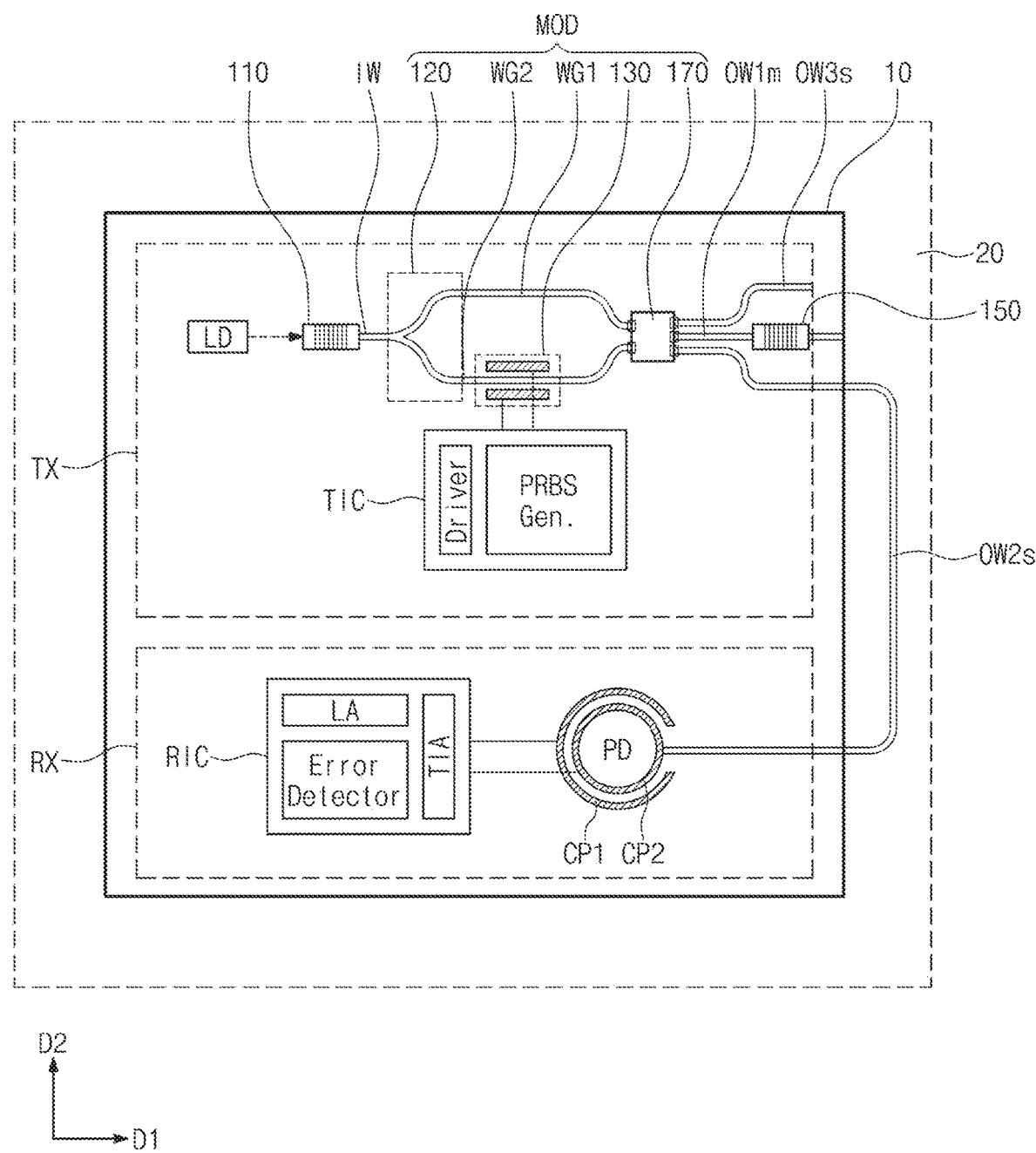

FIGS. 6 and 7 illustrate schematic diagrams showing a photonic integrated circuit device according to some example embodiments of the present inventive concepts. The same technical features as those of the embodiments discussed above with reference to FIGS. 4A and 4B may be omitted in the interest of brevity of description.

Referring to FIG. 6, the scribe line region 20 may surround the chip region 10 of the semiconductor substrate 100, and the chip region 10 may be provided thereon with the optical transmitter TX and the optical receiver RX.

As discussed above, the optical transmitter TX may include the light-source device LD, the optical modulator MOD, and the transmission circuit device TIC. In addition, the optical transmitter TX may further include a variable optical attenuator 160.

The optical attenuator 160 may be constituted by coupling a PIN diode to the second output optical waveguide OW2. The optical attenuator 160 may estimate receiver sensitivity based on power strength of optical signals by controlling strength of optical signals output from the second output optical waveguide OW2. The present embodiment shows an example in which the optical attenuator 160 is included in the optical transmitter TX, but the optical attenuator 160 may be provided in the optical receiver RX.

Referring to FIG. 7, the optical modulator MOD may include an optical combiner 170 that has three output ports and output optical waveguides OW1m, OW2s, and OW3s that are correspondingly connected to the three output ports.

The optical combiner 170 may be configured to allow the three output ports to externally output optical signals generated from the optical combiner 170, and thus it may be possible to prevent the occurrence of internal reflection light in the optical combiner 170.

The output optical waveguides OW1m, OW2s, and OW3s may include a main optical waveguide OW1m, a first subsidiary optical waveguide OW2s, and a third subsidiary optical waveguide OW3s. The main optical waveguide OW1m may output a main optical signal that has experienced constructive interference, and the first and second subsidiary optical waveguides OW2s and OW3s may output subsidiary optical signals that have experienced destructive interference.

One of the first and second subsidiary optical waveguides OW2s and OW3s may be connected to the photodetector PD of the optical receiver RX. Before the test process, one of optical signals output from the optical transmitter TX may be a test optical signal provided to the optical receiver RX. The main optical waveguide OW1m may correspond to the first output optical waveguide OW1 of FIG. 4A. One or more of the first and second subsidiary optical waveguides OW2s and OW3s may correspond to the second output optical waveguide OW2 of FIG. 4A.

Figure 8A:
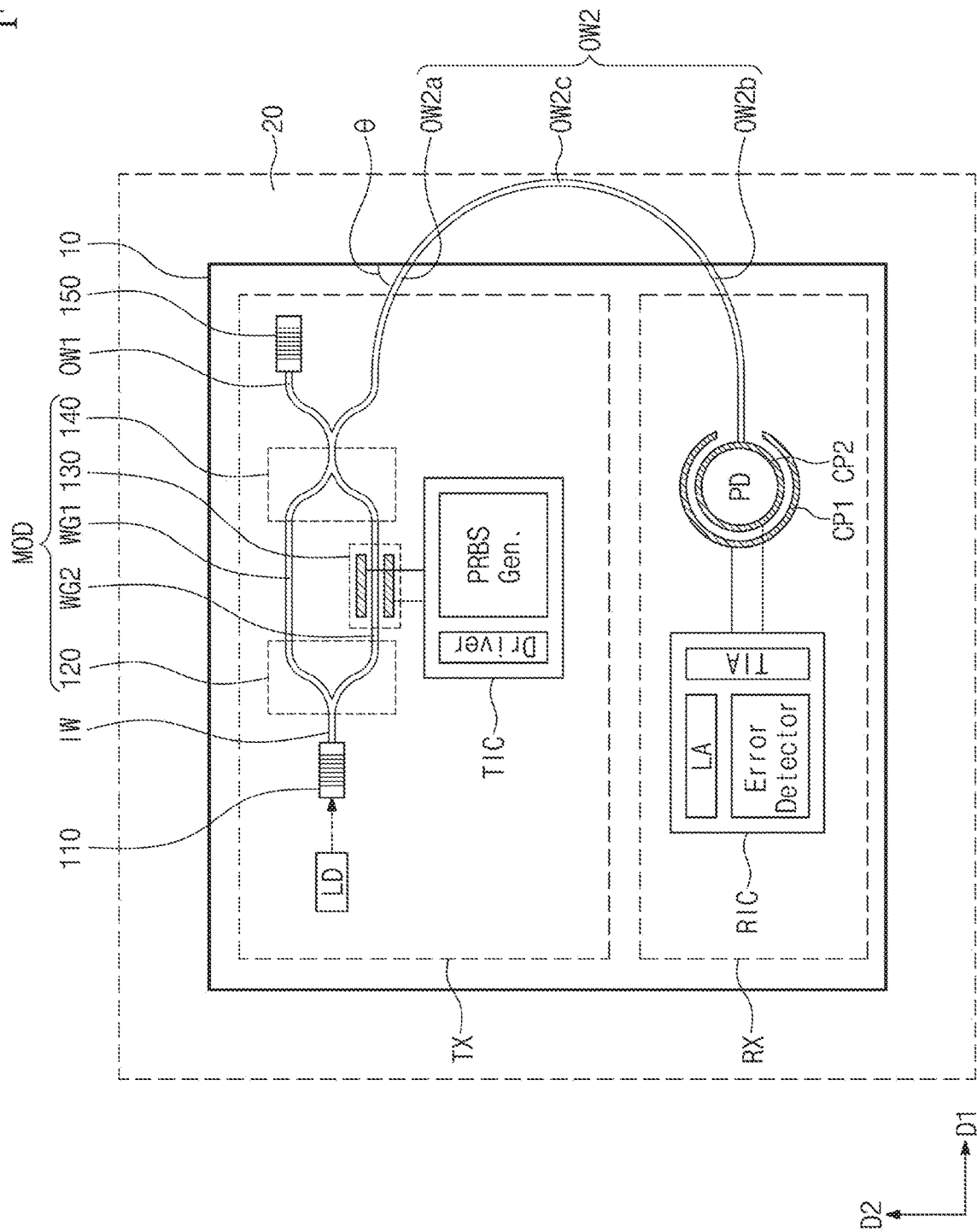
FIGS. 8A and 8B illustrate schematic diagrams showing states before and after testing a photonic integrated circuit device according to some example embodiments of the present inventive concepts.
Figure 8B:
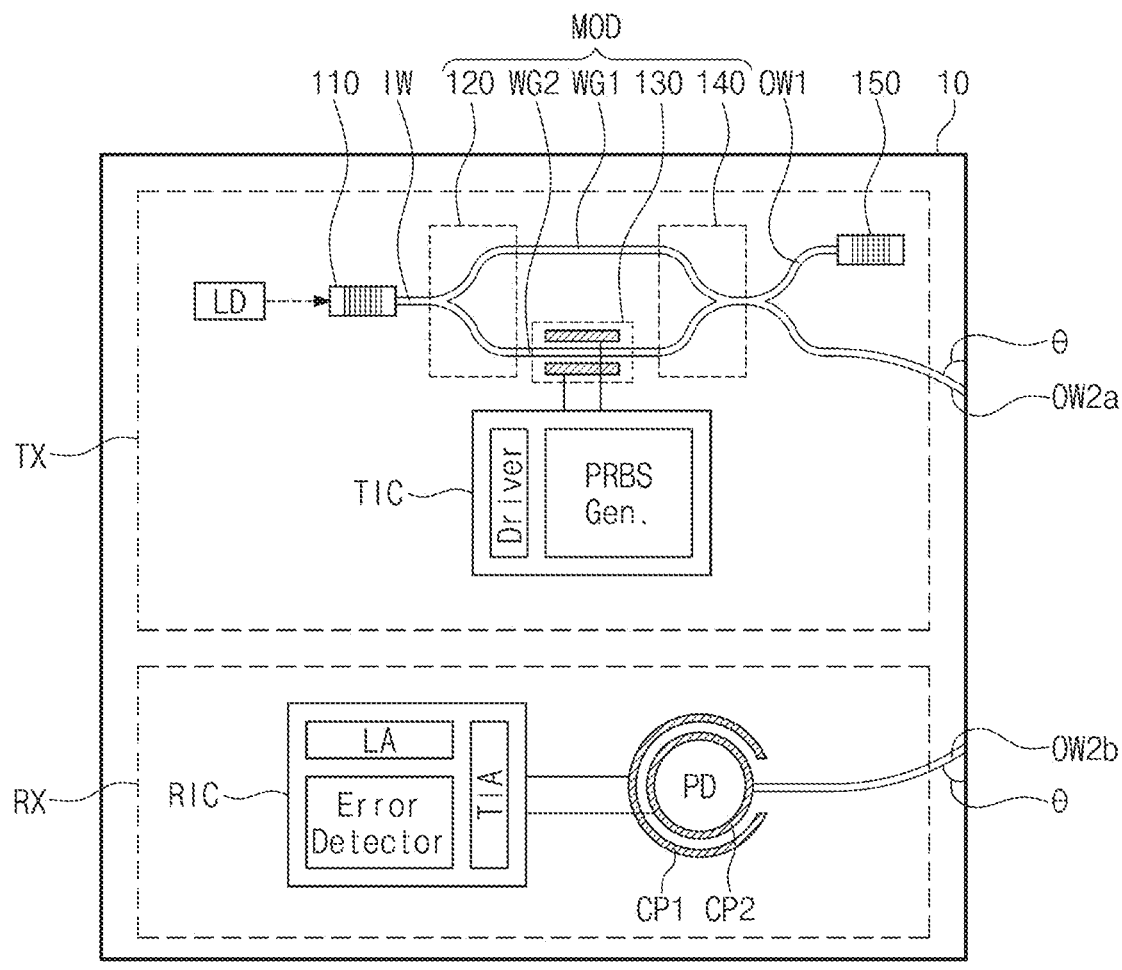

FIGS. 8A and 8B illustrate schematic diagrams showing states before and after testing a photonic integrated circuit device according to some example embodiments of the present inventive concepts. The same technical features as those of the embodiments discussed above with reference to FIGS. 4A and 4B may be omitted in the interest of brevity of description.

Referring to FIGS. 1 and 8A, the second output optical waveguide OW2 may not be perpendicular to extending directions of the scribe line region 20. The second output optical waveguide OW2 may not be parallel to the first and second directions D1 and D2 perpendicular to each other.

The second output optical waveguide OW2 may include an output segment OW2a connected to the optical transmitter TX, an input segment OW2b connected to the optical receiver RX, and an interconnection segment OW2c between the output segment OW2a and the input segment OW2b. The output segment OW2a and the input segment OW2b may be formed on the chip region 10, and the interconnection segment OW2c may be formed on the scribe line region 20. The output segment OW2a and the input segment OW2b may not be parallel to the first and second directions D1 and D2. For example, the output segment OW2a and the input segment OW2b may be at an angle θ with the first direction D1 or the second direction D2.

After the semiconductor substrate 100 undergoes the test process on the photonic integrated circuit devices, the semiconductor substrate 100 may be cut along the scribe line regions 20.

Referring to FIGS. 1 and 8B, after the semiconductor substrate 100 is cut, the second output optical waveguide OW2 and a dicing surface of the scribe line region 20 may be at an angle θ less than about 90°. The second output optical waveguide OW2 may have a cutting surface exposed to air. Because the second output optical waveguide OW2 is not perpendicular to the scribe line region 20 as discussed above, optical signals output from the second output optical waveguide OW2 may be prevented from being reflected from the cutting surface and turned back to the second output optical waveguide OW2.

Figure 9:
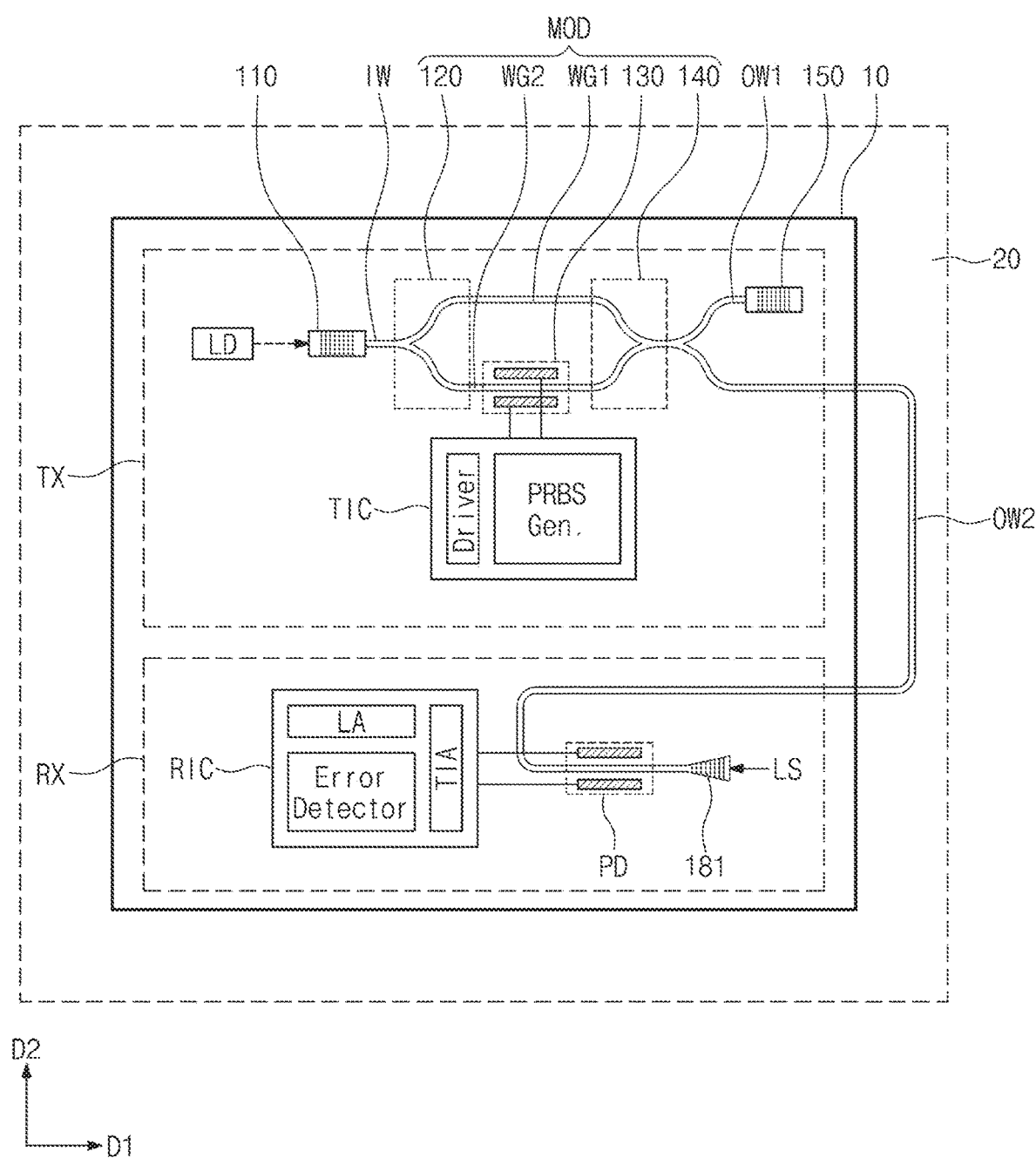
FIGS. 9 to 12 illustrate schematic diagrams showing a photonic integrated circuit device according to some example embodiments of the present inventive concepts.

FIGS. 9 to 12 illustrate schematic diagrams showing a photonic integrated circuit device according to some example embodiments of the present inventive concepts. Referring to FIG. 9, the scribe line region 20 may surround the chip region 10 of the semiconductor substrate 100, and the chip region 10 may be provided thereon with the optical transmitter TX and the optical receiver RX.

As discussed above, the optical transmitter TX may include the light-source device LD, the optical modulator MOD, and the transmission circuit device TIC. As explained above, the optical receiver RX may include the photodetector PD and the reception circuit device RIC.

The photodetector PD may be photodiodes integrated on an optical waveguide. In addition, the optical receiver RX may further include a grating coupler 181 connected to the optical waveguide of the photodetector PD.

For example, similarly to that shown in FIG. 5B, the photodetector PD may include a cladding layer on the semiconductor substrate 100, a silicon core layer on the cladding layer, and a germanium pattern on the silicon core layer. The silicon core layer may include a first region having an n-type dopant, a second region having a p-type dopant, and a third region between the first region and the second region. The first and second regions may be horizontally spaced apart from each other across the third region.

The germanium pattern may be either formed of extrinsic germanium doped with a first or second conductive type dopant to have a certain concentration of charge carriers or formed of undoped intrinsic germanium. The first region of the silicon core layer may be connected to the reception circuit device RIC through a first conductive plug and a first conductive line, and the second region of the silicon core layer may be connected to the reception circuit device RIC through a second conductive plug and a second conductive line. The third region of the silicon core layer may absorb optical signals and convert the absorbed optical signals into electrical signals. Charge carriers generated from optical signals at the third region may be input to and/or output from the first region or the second region, and thus the photodetector PD may output electrical signals corresponding to input optical signals.

The grating coupler 181 may be connected to one side of the silicon core layer, and the second output optical waveguide OW2 may be connected to other side of the silicon core layer. For example, test optical signals may be provided to the photodetector PD during the test process, and external optical signals LS may be provided through the grating coupler 181 to the photodetector PD after the test process and the cutting process.

Figure 10:
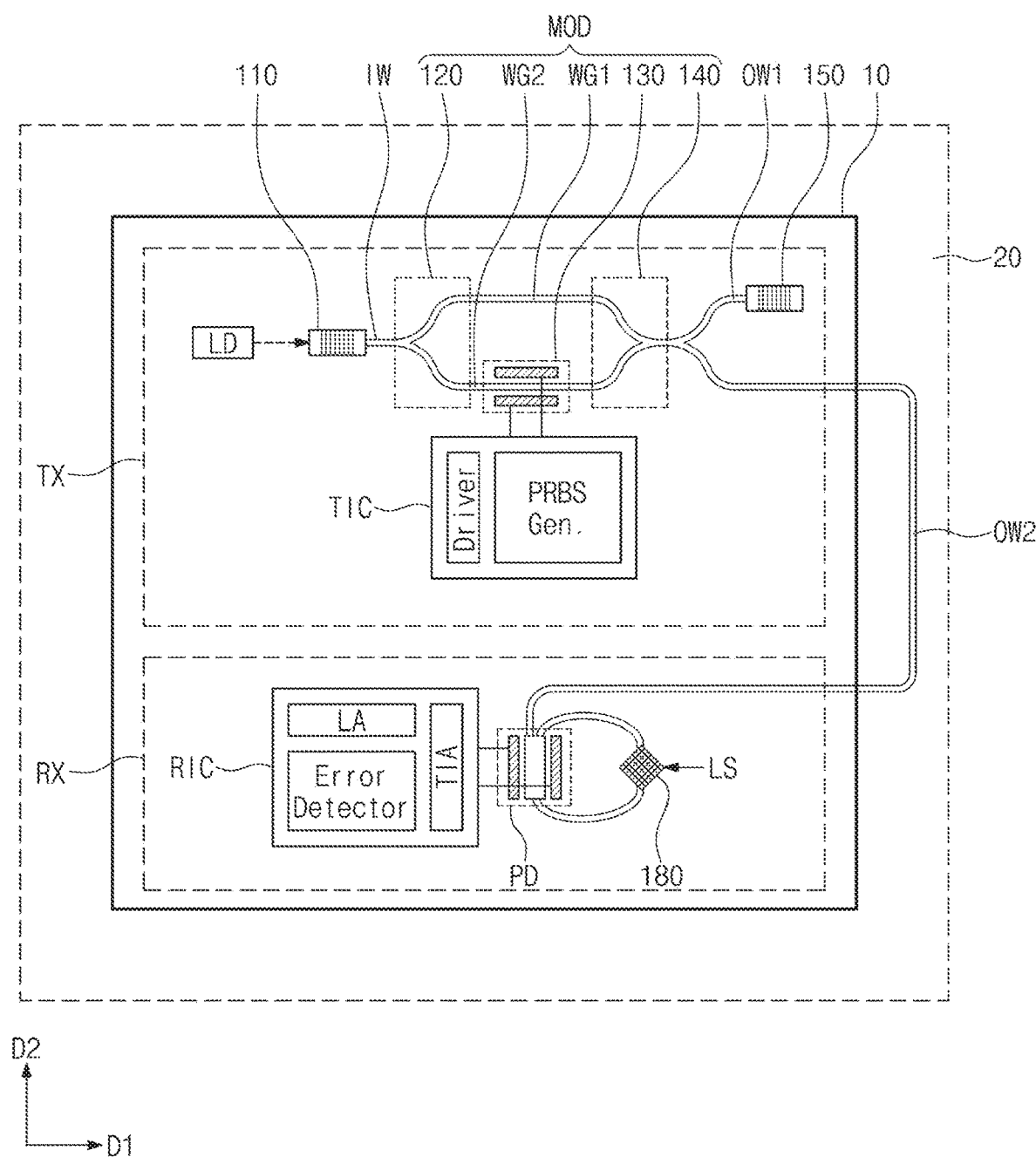

Referring to FIG. 10, the optical receiver RX may include a photodetector PD, a two-dimensional grating coupler 180, and first and second input optical waveguides (not designated by reference numerals) that connect the two-dimensional grating coupler 180 to the photodetector PD. As discussed hereinabove with reference to FIG. 9, the photodetector PD may be photodiodes integrated on an optical waveguide. Externally input optical signals LS may be distributed through the two-dimensional grating coupler 180 into the first and second input optical waveguides.

The two-dimensional grating coupler 180 may include two-dimensional regular patterns at which light is refracted. The first input optical waveguide may be connected to one end of the two-dimensional grating coupler 180, and the second input optical waveguide may be connected to other end of the two-dimensional grating coupler 180.

The first input optical waveguide may be connected to one end of the silicon core layer of the photodetector PD, and the second input optical waveguide may be connected to other end of the silicon core layer of the photodetector PD.

The one end of the silicon core layer may be connected to the second output optical waveguide OW2 that connects the optical transmitter TX to the photodetector PD. The second output optical waveguide OW2 and the first input optical waveguide may be provided therebetween with silicon oxide to prevent interference of optical signals. Because the second output optical waveguide OW2 is cut after the test process on the photonic integrated circuit device and the cutting process on the semiconductor substrate 100, no optical signals may be provided to the second output optical waveguide OW2.

Figure 11:
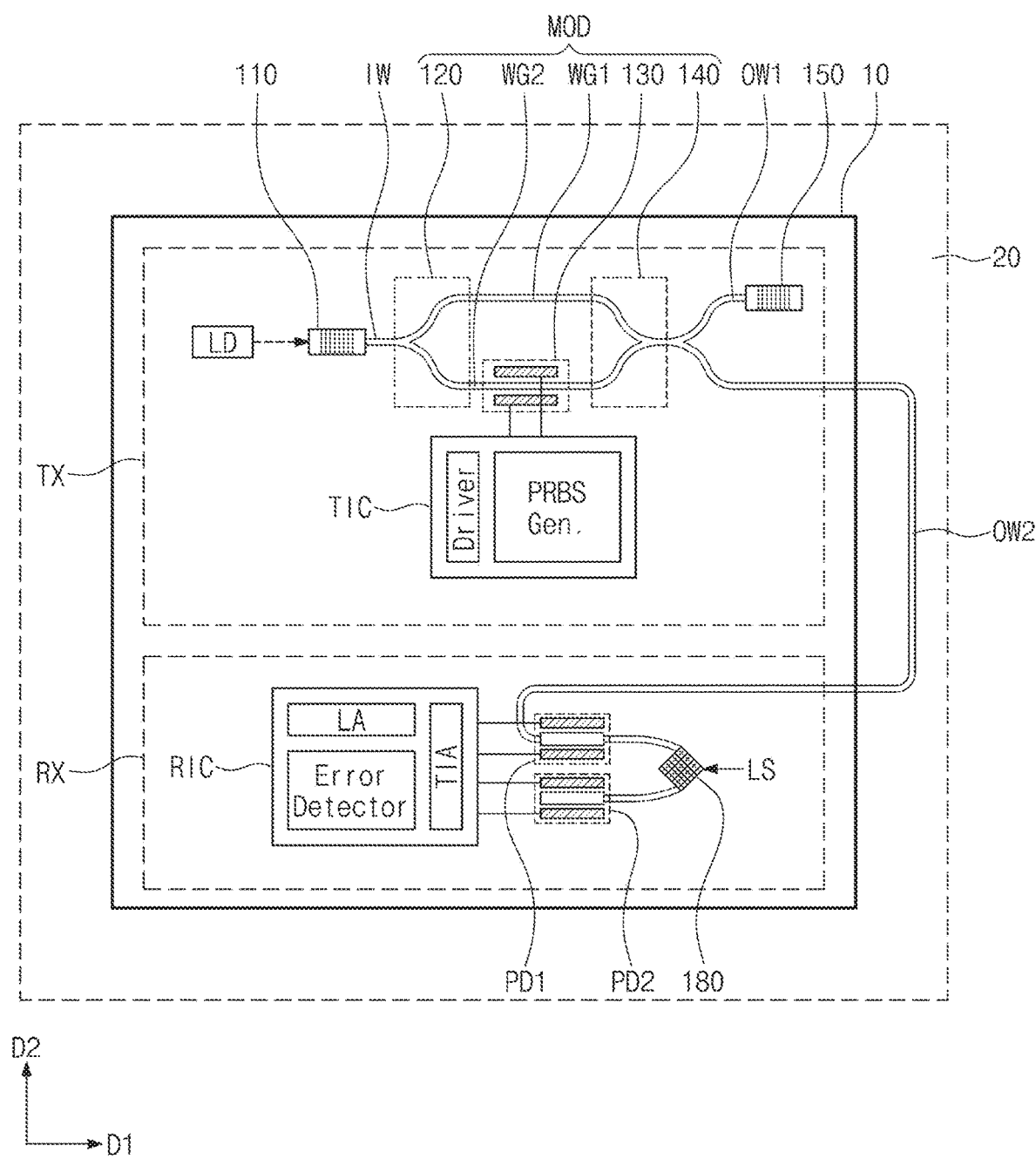
Figure 12:
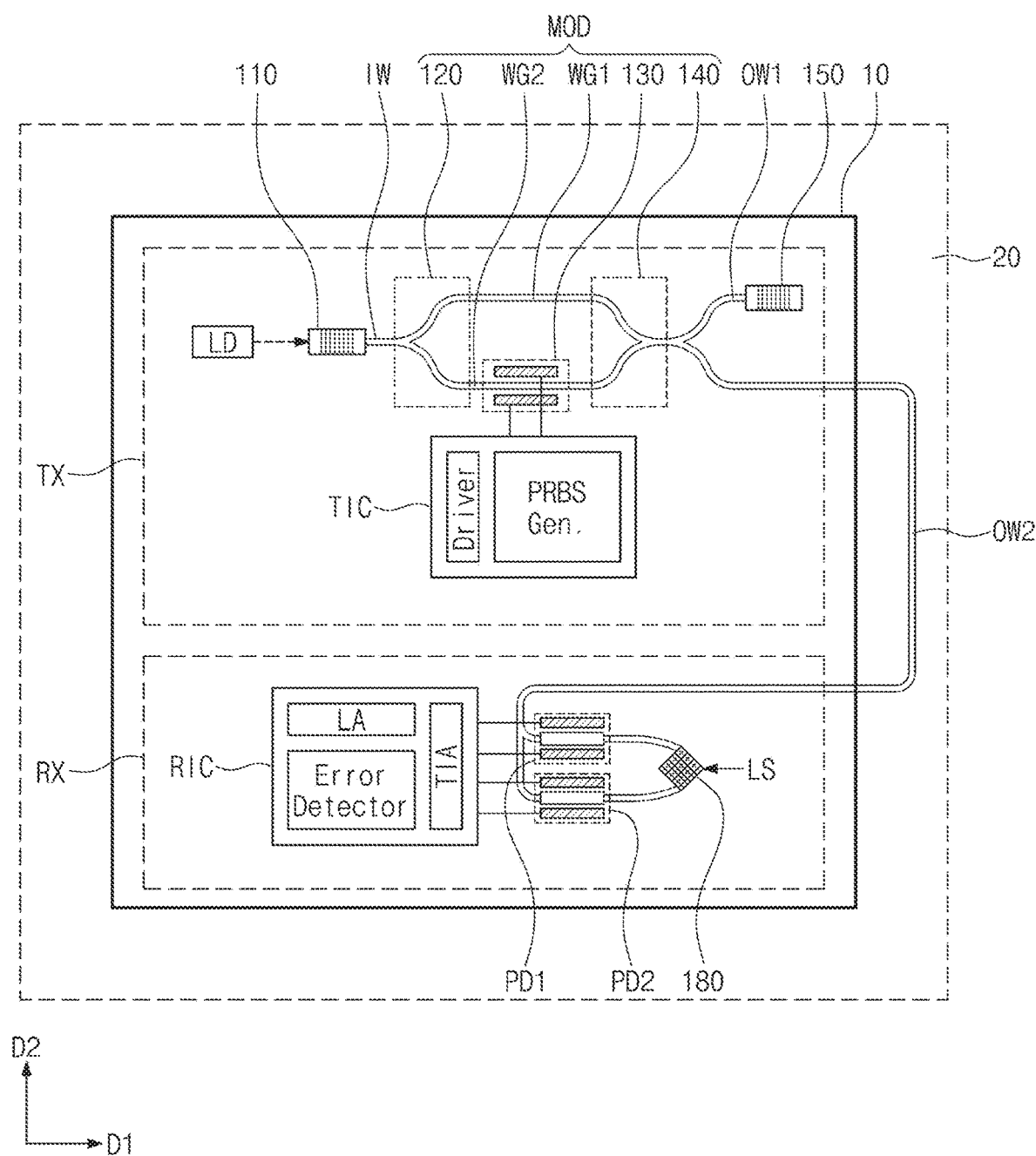

Referring to FIGS. 11 and 12, the optical receiver RX may include first and second photodetectors PD1 and PD2, a two-dimensional grating coupler 180, and first and second input optical waveguides (not designated by reference numerals). The first input optical waveguide may connect the first photodetector PD1 to an end of the two-dimensional grating coupler 180, and the second input optical waveguide may connect the second photodetector PD2 to other end of the two-dimensional grating coupler 180.

As shown in FIG. 11, the second output optical waveguide OW2 may be connected to one of the first and second photodetectors PD1 and PD2. Alternatively, as shown in FIG. 12, the second output optical waveguide OW2 may be branched into two pieces, which are connected to the first and second photodetectors PD1 and PD2.

Figure 13:
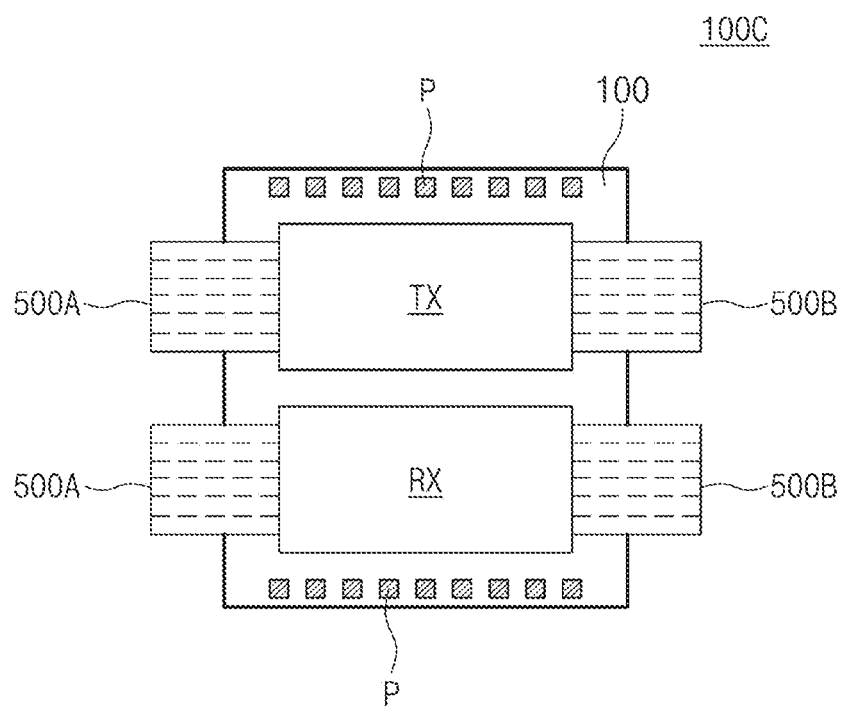
FIG. 13 illustrates a simplified plan view showing a semiconductor package including a photonic integrated circuit device according to some example embodiments of the present inventive concepts.
Figure 14:
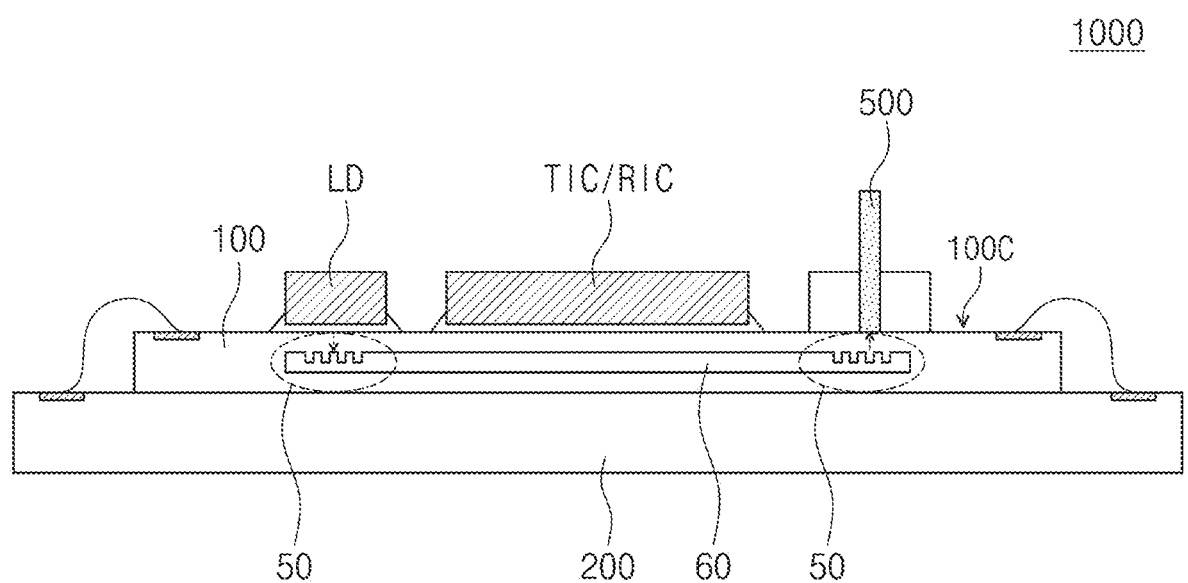
FIG. 14 illustrates a simplified plan view showing a semiconductor package including a photonic integrated circuit device according to some example embodiments of the present inventive concepts.

FIG. 13 illustrates a simplified plan view showing a semiconductor package including a photonic integrated circuit device according to some example embodiments of the present inventive concepts. FIG. 14 illustrates a simplified plan view showing a semiconductor package including a photonic integrated circuit device according to some example embodiments of the present inventive concepts.

Referring to FIG. 13, a photonic integrated circuit package 1000 of FIG. 14 may include a photonic integrated circuit device 100C, an electrical interface 500A, and an optical interface 500B. The photonic integrated circuit device 100C may be formed on a semiconductor substrate 100 and may include input/output pads P for connection with an external electronic device. The electrical interface 500A may be connected one side of the photonic integrated circuit device 100C, and the optical interface 500B may be connected other side of the photonic integrated circuit device 100C.

Electrical signals may be input to the optical receiver RX or output from the optical transmitter TX through interconnection lines of the electrical interface 500A. The optical interface 500B may be a single optical fiber or an optical fiber array including a plurality of optical fibers. Optical signals may be input and output through the optical fibers of the optical interface 500B.

Referring to FIG. 14, a package substrate 200 may be provided thereon with the photonic integrated circuit device 100C formed by the fabrication processes discussed above. The package substrate 200 may be, for example, a printed circuit board, a flexible substrate, or a tape substrate. The package substrate 200 may be one of a flexible printed circuit board, a rigid printed circuit board, and a combination thereof, each of which includes internal connection lines formed therein.

The package substrate 200 may have top and bottom surfaces facing each other and include bonding pads, internal connection lines ICL, and external connection pads. The photonic integrated circuit device 100C may be provided on a central portion of the top surface of the package substrate 200.

The photonic integrated circuit package 1000 may include the photonic integrated circuit device 100C formed on the semiconductor substrate 100. The semiconductor substrate 100 may be a silicon substrate or a III-V group semiconductor substrate. The semiconductor substrate 100 may be provided with an optical waveguide, an optical modulator, a grating coupler, and a photodetector that are discussed with reference to figures above. For brevity of drawings, FIG. 14 selectively shows a grating coupler 50 and an optical waveguide 60.

The light-source device LD and the transmission/reception circuit devices TIC/RIC may be attached through adhesive layers to the semiconductor substrate 100. The transmission/reception circuit devices TIC/RIC may be electrically connected through conductive pads to other conductive pads provided on the semiconductor substrate 100. The semiconductor substrate 100 may be provided on its one side with an optical interface, for example, an optical fiber 500. The optical fiber 500 may be optically connected through the grating coupler 50 to the optical waveguide 60 formed on the semiconductor substrate 100.

The package substrate 200 may be provided on its top surface with a molding layer (not shown) covering the photonic integrated circuit device 100C. The molding layer may include an epoxy molding compound (EMC). The semiconductor substrate 100 may be wire-bonded to the package substrate 200.

According to some example embodiments of the present inventive concepts, a semiconductor substrate may be provided thereon with a test optical waveguide that connects an optical transmitter to an optical receiver. When electrical test signals are provided to the optical transmitter formed on the semiconductor substrate, the optical receiver may receive optical test signals through the test optical waveguide. As a result, before photonic integrated circuit devices are individually separated, the optical transmitter and receiver on the semiconductor substrate (e.g., wafer) may be tested only with an electrical probe without using an optical probe.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. In an integrated circuit substrate having a first chip region therein, which includes an optical transmitter, an optical receiver and a test optical waveguide optically coupled to the optical transmitter and the optical receiver, a method of forming a photonic integrated circuit device, comprising:
dicing the integrated circuit substrate along a plurality of scribe lines to thereby define a first integrated circuit chip comprising the first chip region, said dicing comprising cutting a portion of the test optical waveguide overlapping one of the plurality of scribe lines,
wherein the optical transmitter comprises a light-source device configured to generate an optical signal, and an optical modulator configured to: (i) divide the optical signal into first and second optical signal components, which are provided onto respective first and second optical waveguides, (ii) modulate a phase of the second optical signal component on the second optical waveguide relative to a phase of the first optical signal component on the first optical waveguide, and (iii) optically couple the modulated second optical signal component to the first optical signal component.

2. The method of claim 1, wherein said dicing comprises cutting the test optical waveguide in two locations to thereby optically disconnect the optical transmitter and optical receiver from each other.

3. The method of claim 1, wherein the optical receiver comprises a photodetector optically coupled to the test optical waveguide.

4. The method of claim 1, wherein the optical receiver comprises a photodetector optically coupled to the test optical waveguide, and
wherein the photodetector comprises a cladding layer on the substrate, a silicon core layer on the cladding layer and a germanium pattern on the silicon core layer; and
wherein the test optical waveguide is connected to the silicon core layer.

5. The method of claim 4, wherein the silicon core layer comprises an N-type doping region; and wherein the germanium pattern comprises a P-type doping region spaced from the silicon core layer.

6. The method of claim 4, wherein the silicon core layer includes a first region, a second region and a third region extending between the first and second regions; wherein the germanium pattern extends on the third region; and wherein the test optical waveguide is optically coupled to the third region.

7. The method of claim 6, wherein the first region comprises a P-type dopant and the second region comprises an N-type dopant.

8. The method of claim 6, further comprising an input grating coupler, which is optically coupled to the silicon core layer.

9. The method of claim 1, wherein test optical waveguide is configured to provide the optical receiver with an optical test signal that is output from the optical transmitter.

10. The method of claim 1, wherein the test optical waveguide comprises an output segment connected to the optical transmitter, and an input segment connected to the optical receiver; and wherein the output segment crosses the first scribe line and the input segment crosses the first scribe line.

11. The method of claim 1, wherein the optical transmitter comprises an optical output part that outputs the modulated optical signal.

12. The method of claim 11, wherein the optical output part comprises:
   a first output waveguide optically coupled to an output of the optical modulator to thereby receive a first modulated optical signal therefrom; and
   a second output waveguide optically coupled to an output of the optical modulator to thereby receive a second modulated optical signal therefrom.

13. A method of fabricating a photonic integrated circuit device, the method comprising:
   providing a semiconductor substrate that includes a plurality of chip regions and a scribe line region between the chip regions;
   forming a plurality of photonic integrated circuit devices on corresponding chip regions, each of the photonic integrated circuit devices including an optical transmitter, an optical receiver, and a test optical waveguide that connects the optical transmitter to a photodetector within the optical receiver and overlaps the scribe line region;
   performing a test process in which the optical transmitter is provided with an electrical test signal to test the optical transmitter and the optical receiver; and thereafter
   cutting the semiconductor substrate along the scribe line region to individually separate the photonic integrated circuit devices; and
   wherein the photodetector comprises:
      a cladding layer on the semiconductor substrate;
      a silicon core layer on the cladding layer; and
      a germanium pattern on the silicon core layer,
      wherein the test optical waveguide is connected to one side of the silicon core layer.

14. The method of claim 13, wherein performing the test process comprises:
   providing the optical transmitter with the electrical test signal to allow the test optical waveguide to output an optical test signal; and
   allowing the optical receiver to detect the optical test signal.

15. The method of claim 13, wherein cutting the semiconductor substrate comprises slicing the test optical waveguide.

16. The method of claim 13, wherein
   the scribe line region extends in a first direction and a second direction perpendicular to the first direction, and
   the test optical waveguide comprises:
      an output segment connected to the optical transmitter;
      an input segment connected to the optical receiver; and
      an interconnection segment between the output segment and the input segment,
      wherein the interconnection segment is disposed on the scribe line region.

17. The method of claim 16, wherein the output segment and the input segment are not parallel to the first and second directions.

18. A method of fabricating a photonic integrated circuit device, the method comprising:
   providing a semiconductor substrate that includes a plurality of chip regions and a scribe line region between the chip regions;
   forming a plurality of photonic integrated circuit devices on corresponding chip regions, each of the photonic integrated circuit devices including an optical transmitter, an optical receiver, and a test optical waveguide that connects the optical transmitter to the optical receiver and overlaps the scribe line region;
   performing a test process in which the optical transmitter is provided with an electrical test signal to test the optical transmitter and the optical receiver; and thereafter
   cutting the semiconductor substrate along the scribe line region to individually separate the photonic integrated circuit devices;
   wherein the optical transmitter is configured to output a first optical signal and a second optical signal; and
   wherein the first and second optical signals are complementary to each other.

19. The method of claim 13, wherein the optical transmitter is configured to output a first optical signal and a second optical signal; and wherein the first and second optical signals are complementary to each other.

* * * * *